United States Patent
Jeddeloh

(10) Patent No.: US 6,629,222 B1
(45) Date of Patent: *Sep. 30, 2003

(54) APPARATUS FOR SYNCHRONIZING STROBE AND DATA SIGNALS RECEIVED FROM A RAM

(75) Inventor: Joseph M. Jeddeloh, Minneapolis, MN (US)

(73) Assignee: Micron Technology Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/352,719

(22) Filed: Jul. 13, 1999

(51) Int. Cl.$^7$ .......................... G06F 12/00; G06F 13/00
(52) U.S. Cl. ........................ 711/167; 711/104; 713/401; 365/193; 365/194
(58) Field of Search ................................. 711/104, 167; 710/52–53, 240, 58–59; 365/193–194, 233, 189.05; 713/400–401

(56) References Cited

U.S. PATENT DOCUMENTS

| | | | | |
|---|---|---|---|---|
| 5,406,518 A | * | 4/1995 | Sun et al. | 365/194 |
| 5,475,690 A | * | 12/1995 | Burns et al. | 370/519 |
| 5,615,358 A | * | 3/1997 | Vogley | 713/501 |
| 5,644,387 A | * | 7/1997 | Oda et al. | 356/5.01 |
| 5,790,869 A | * | 8/1998 | Melo et al. | 710/240 |
| 5,864,568 A | * | 1/1999 | Nemazie | 371/40.14 |
| 5,948,114 A | * | 9/1999 | Klinger | 714/733 |
| 6,016,282 A | * | 1/2000 | Keeth | 365/233 |
| 6,029,250 A | * | 2/2000 | Keeth | 413/400 |
| 6,442,644 B1 | * | 8/2002 | Gustavson et al. | 711/105 |

* cited by examiner

*Primary Examiner*—Reginald G. Bragdon
*Assistant Examiner*—Pierre M. Vital
(74) *Attorney, Agent, or Firm*—Park, Vaughan & Fleming LLP

(57) ABSTRACT

One embodiment of the present invention provides an apparatus that synchronizes a data signal and a data strobe signal received from a random access memory. This apparatus includes a mechanism that initiates a read operation to the random access memory by sending a target address for the read operation to the random access memory. The apparatus also includes an input driver that receives the data signal containing data retrieved from the target address from the random access memory. Coupled to the input driver is a register that stores the data signal. A first programmable delay circuit is coupled to an enable input of the input driver in order to synchronize the driving of the input driver with the data signal received from the random access memory. A second programmable delay circuit is coupled between the data strobe signal and a clock input of the register. This second programmable delay circuit is configured to delay the data strobe signal so as to synchronize the data strobe signal with the data signal received from the random access memory. One embodiment of the present invention includes an initialization mechanism that determines the first delay value and the second delay value by performing test read operations using a plurality of different combinations of different first delay values and different second delay values. In a variation on this embodiment, this initialization mechanism includes code executed during a system boot process that determines the first delay value and the second delay value.

18 Claims, 6 Drawing Sheets

APPARATUS FOR SYNCHRONIZING STROBE AND DATA SIGNALS RECEIVED FROM A RAM

RELATED APPLICATION

The subject matter of this application is related to the subject matter in a co-pending non-provisional application by the same inventor as the instant application and filed on the same day as the instant application entitled, "Method for Synchronizing Strobe and Data Signals Received from a RAM," having Ser. No. 09/352,718, and filing date Jul. 13, 1999 now U.S. Pat. No. 6,453,402.

BACKGROUND

1. Field of the Invention

The present invention relates to memory systems for computers, and more particularly to the design of a memory interface that automatically adjusts the timing between read data and an associated strobe signal returning from a memory during a read operation. The present invention also adjusts timing between the read data and an input driver enable signal.

2. Related Art

As processor speeds continue to increase, memory systems are under increasing pressure to provide data at faster rates. This has recently led to the development of new memory system designs. Memory latencies have been dramatically decreased by using page mode and extended data out (EDO) memory designs, which achieve a high burst rate and low latencies within a single page of memory. Another recent innovation is to incorporate a synchronous clocked interface into a memory chip, thereby allowing data from within the same page of memory to be clocked out of the memory chip in a continuous stream. Such memory chips with clocked interfaces are known as synchronous random access memories.

Recently, standards such as SyncLink and DDR have been developed to govern the transfer of data between memory and processor using such clocked interfaces.

SyncLink, which will be known as IEEE Standard 1596.7, specifies an architecture that supports a 64M-bit memory with a data transfer rate of 1.6 gigabytes per second.

DDR is an acronym for Double Data Rate SDRAM; SDRAM is an acronym for Synchronous Dynamic Random Access Memory. During read operations, DDR memories return a bi-directional data strobe signal (or data clock signal) along with the data. The data is clocked into the processor (or memory controller) on both edges of the data strobe signal. This differs from conventional memory systems, which rely on the system clock to latch the data received during a read operation.

Designing an interface that receives a data strobe signal from a DDR memory during a read operation presents challenges because a certain amount of skew typically arises between the data signal and the data strobe signal. If this skew is large enough, a data strobe edge, which is used to latch the data signal, can move from the center of the "data eye" of the data signal into a transitional region or into another data eye. This may cause spurious data to be latched during a read operation. Skew may additionally arise between the data signal and an enable signal for an input driver that is used to drive the data signal from a memory bus into a latch in the processor (or in the memory controller). This type of skew may also cause spurious data to be latched during read operations.

What is needed is a system that adjusts the temporal alignment between a data signal and an associated data strobe signal received from a memory during a read operation. Additionally, what is needed is a system that adjusts the temporal alignment between a data signal received during a read operation and an associated input driver enable signal.

SUMMARY

One embodiment of the present invention provides an apparatus that synchronizes a data signal and a data strobe signal received from a random access memory. This apparatus includes a mechanism that initiates a read operation to the random access memory by sending a target address for the read operation to the random access memory. The apparatus also includes an input driver that receives the data signal containing data retrieved from the target address from the random access memory. Coupled to the input driver is a register that stores the data signal. A first programmable delay circuit is coupled to an enable input of the input driver in order to synchronize the driving of the input driver with the data signal received from the random access memory. A second programmable delay circuit is coupled between the data strobe signal and a clock input of the register. This second programmable delay circuit is configured to delay the data strobe signal so as to synchronize the data strobe signal with the data signal received from the random access memory.

One embodiment of the present invention includes a mechanism to program the first programmable delay circuit with a first delay value, and a mechanism to program the second programmable delay circuit with a second delay value.

One embodiment of the present invention includes an initialization mechanism that determines the first delay value and the second delay value by performing test read operations using a plurality of different combinations of different first delay values and different second delay values. In a variation on this embodiment, this initialization mechanism includes code executed during a system boot process that determines the first delay value and the second delay value.

In one embodiment of the present invention, the first programmable delay circuit includes a coarse delay adjustment mechanism and a fine delay adjustment mechanism.

One embodiment of the present invention includes a circuit that de-asserts the enable signal a fixed amount of time after the enable signal is asserted.

One embodiment of the present invention includes a circuit that de-asserts the enable signal a programmable amount of time after the enable signal is asserted.

In one embodiment of the present invention, the random access memory is comprised of a plurality of memory modules, wherein a different first delay value and a different second delay value are associated with each memory module. This embodiment further includes a mechanism that examines the target address to determine which memory module the target address is directed to in order to determine an associated first delay value and an associated second delay value for the memory module.

One embodiment of the present invention includes a re-calibration mechanism that periodically measures deviations in propagation delay through the first programmable delay circuit and/or the second programmable delay circuit relative to a system clock, and adjusts the first programmable delay circuit and/or the second programmable delay circuit, if necessary, to compensate for measured deviations.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Computer System

Figure 1:
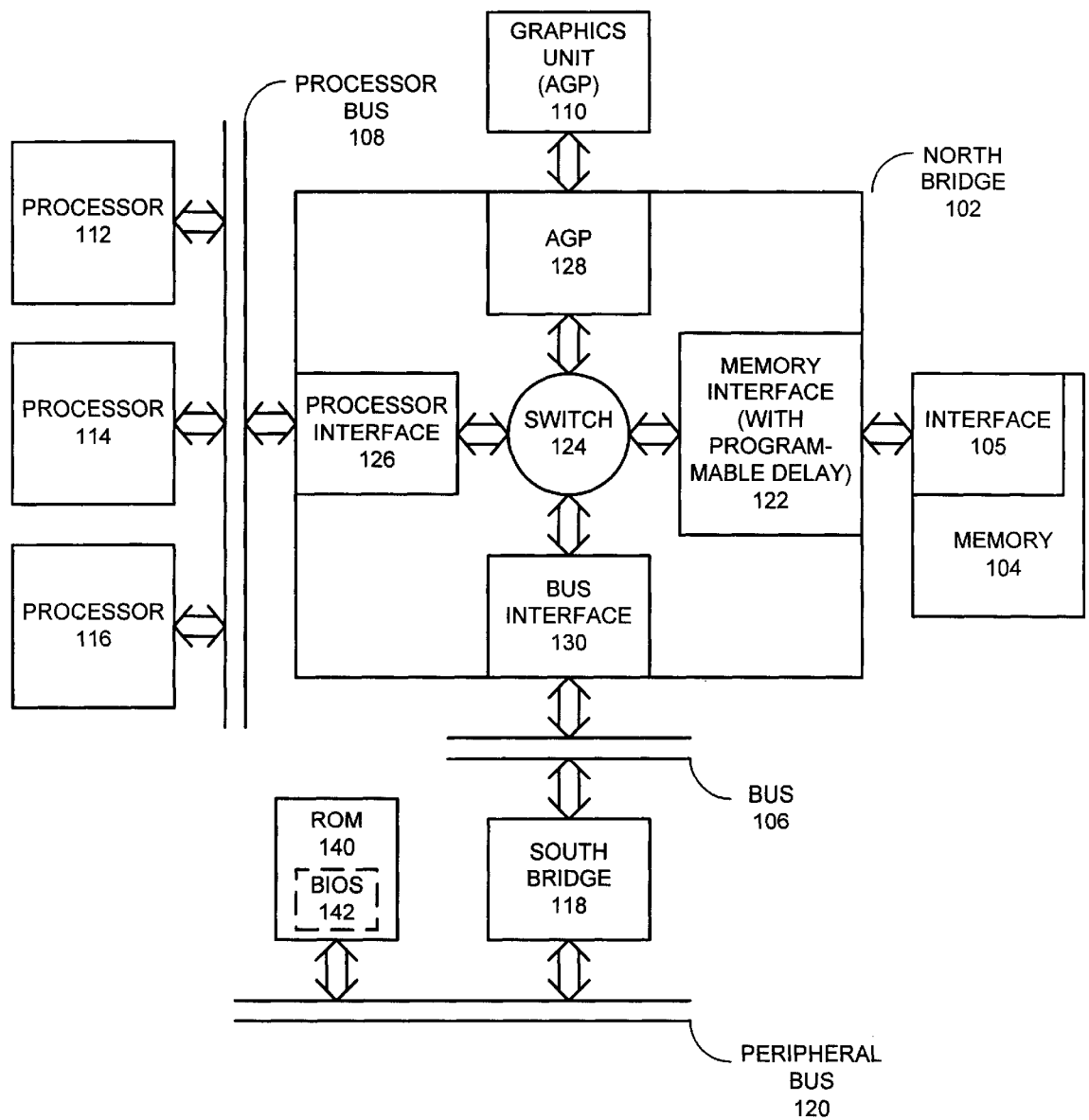
FIG. 1 illustrates a computer system in accordance with an embodiment of the present invention.

FIG. 1 illustrates a computer system in accordance with an embodiment of the present invention. The computer system illustrated in FIG. 1 includes processors 112, 114 and 116, which are coupled to processor bus 108. Processors 112, 114 and 116 may include, any type of general or special purpose processors, including, but not limited to microprocessors, mainframe computers, digital signal processors, graphics processors and device controllers. Processor bus 108 may include any type of communication channel for coupling a processor to other devices in the computer system. These other devices may include peripheral devices, memory devices and even other processors.

North bridge 102 couples processor bus 108 to memory 104, graphics unit 110 and bus 106. As illustrated in FIG. 1, north bridge 102 contains: processor interface 126 for communicating with processor bus 108; accelerated graphics port (AGP) 128 for communicating with graphics unit 110; memory interface 122 for communicating with memory 104; and bus interface 130 for communicating with bus 106. Interfaces 126, 128, 122 and 130 are coupled together through switch 124, which can be any type of switching circuitry that is able to selectively couple together to interfaces 126, 128, 122 and 130.

Memory 104 may be any type of memory with a clocked interface that returns data along with a strobe signal for latching the data during read operations. This may include memory implementing the DDR interface standard. In one embodiment, memory 104 includes a plurality of memory modules, each of which includes a plurality of memory chips. As illustrated in FIG. 1, memory 104 includes interface 105, which interacts with memory interface 122 in north bridge 102 to send data to and receive data from north bridge 102. Note that memory interface 122 includes programmable circuitry for aligning memory reference signals in accordance with an aspect of the present invention.

Graphics unit 110 can include any special-purpose circuitry for performing graphics operations. This allows graphics computations to be off-loaded from processors 112, 114 and 116.

Bus 106 couples north bridge 102 to south bridge 118. Bus 106 may include any type of communication channel for coupling north bridge 102 to other devices in a computer system, including peripheral devices and memory devices. In one embodiment of the present invention, bus 106 is a PCI bus.

South bridge 118 includes circuitry for coupling together components of the computer system. For example, south bridge 118 couples bus 106 to peripheral bus 120.

Peripheral bus 120 may include any type of communication channel for coupling south bridge 118 to other devices in a computer system, including peripheral devices and memory devices. In one embodiment of the present invention, peripheral bus 120 is an ISA bus.

Peripheral bus 120 is coupled to ROM 140, which contains BIOS code 142. In one embodiment of the present invention, BIOS code 142 includes code for aligning data strobe and data signals received at memory interface 122 from memory 104.

The system illustrated in FIG. 1 operates as follows. A processor, such as processor 112, performs a read operation. This read operation is relayed across processor bus 108 into memory interface 122 within north bridge 102. Memory interface 122 sends a read request to interface 105 within memory 104. Interface 105 returns the read data and an associated data strobe signal to memory interface 122. This data strobe signal is used to clock the data into memory interface 122. Next, the read operation is completed by transferring data across processor bus 108 to processor 112.

Memory Controller

Figure 2:
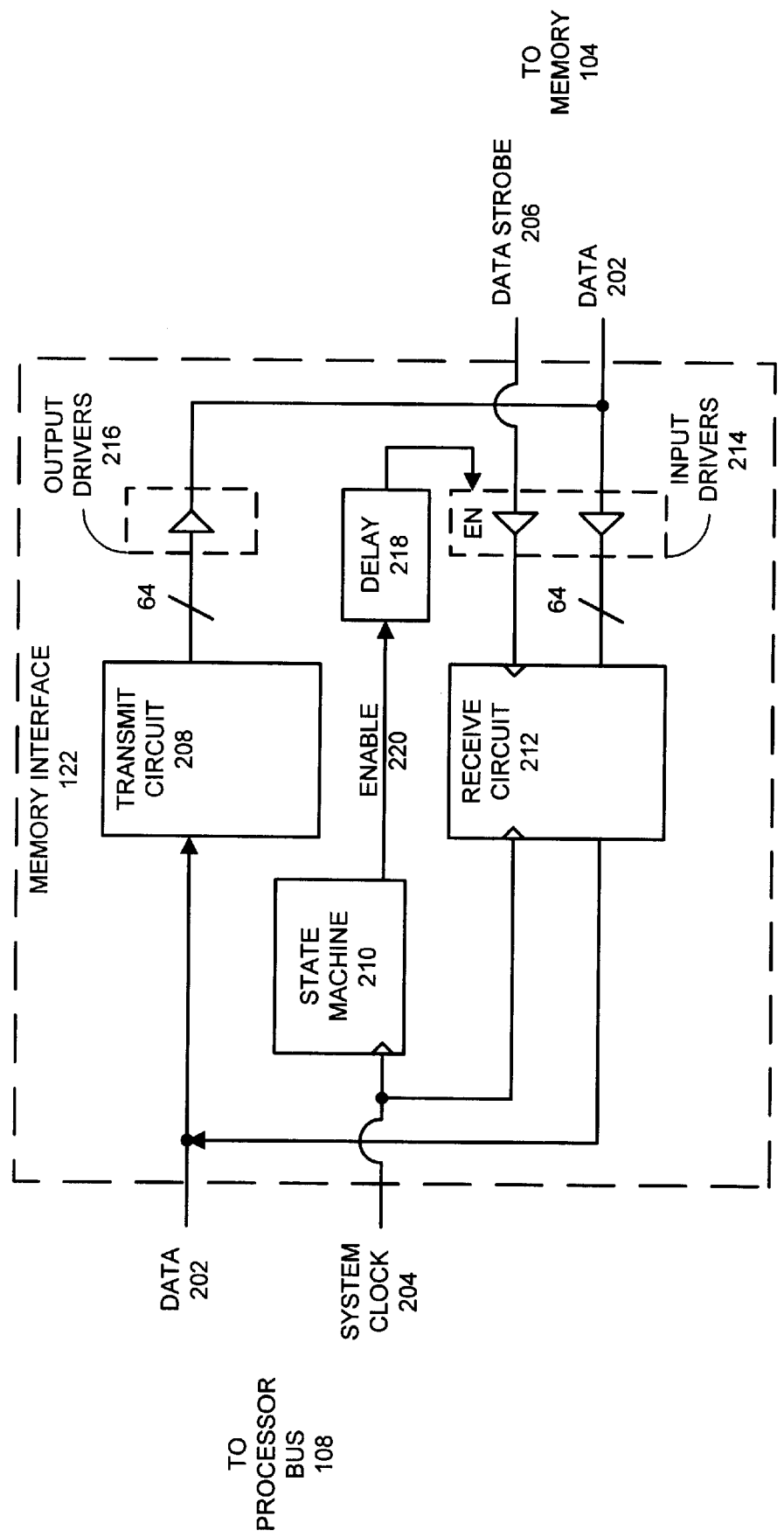
FIG. 2 illustrates a memory interface in accordance with an embodiment of the present invention.

FIG. 2 illustrates the internal structure of memory interface 122 from FIG. 1 in accordance with an embodiment of the present invention. In this embodiment, memory interface 122 contains a number of components, including state machine 210, transmit circuit 208, receive circuit 212, input drivers 214 and output drivers 216. On the right-hand side of FIG. 2, memory interface 122 receives data signal 202 and data strobe signal 206 from memory 104 (from FIG. 1). On the left-hand side, memory interface 122 is coupled to data signal 202 and system clock 204.

Within memory interface 122 there is a transmit path to transmit data to memory 104 during a write operation, and a receive path to receive data from memory 104 during a read operation.

During a write operation, data signal 202 originates from processor bus 108 and passes through transmit circuit 208 and output drivers 216, which drive data signal 202 out to memory 104. Transmit circuit 208 includes a register for storing data signal 202, while data signal 202 is driven out to memory 104.

During a read operation, data signal 202 and data strobe signal 206 from memory 104 passes through input drivers 214 into receive circuit 212. Receive circuit 212 includes circuitry to transfer data signal 202 from the clock domain of data strobe signal 206 into the clock domain of system clock 204. From receive circuit 212, data signal 202 is directed onto processor bus 108.

Note that data strobe signal 206 is used to clock data signal 202 into receive circuit 212.

Also note that state machine 210 generates enable signal 220, which is used to enable input drivers 214. In order to achieve high performance, enable signal 220 must be precisely aligned with data signal 202. This can pose a problem because enable signal 220 is generated by state machine 210, which is governed by system clock 204, while data signal 202 is clocked by data strobe signal 206. For alignment purposes, enable signal 206 passes through delay circuit 218, which can be adjusted to compensate for skew between enable signal 220 and data signal 202. Delay circuit 218 is described in more detail below with reference to FIG. 4.

Note that in the embodiment illustrated in FIG. 1, memory interface 122 resides on north bridge 102. In another embodiment, memory interface 122 resides within a processor. Also note that although input drivers 214 and output drivers 216 appear as separate devices in FIG. 1, they may actually be combined into unified bi-directional I/O drivers (buffers).

Receive Circuit

Figure 3:
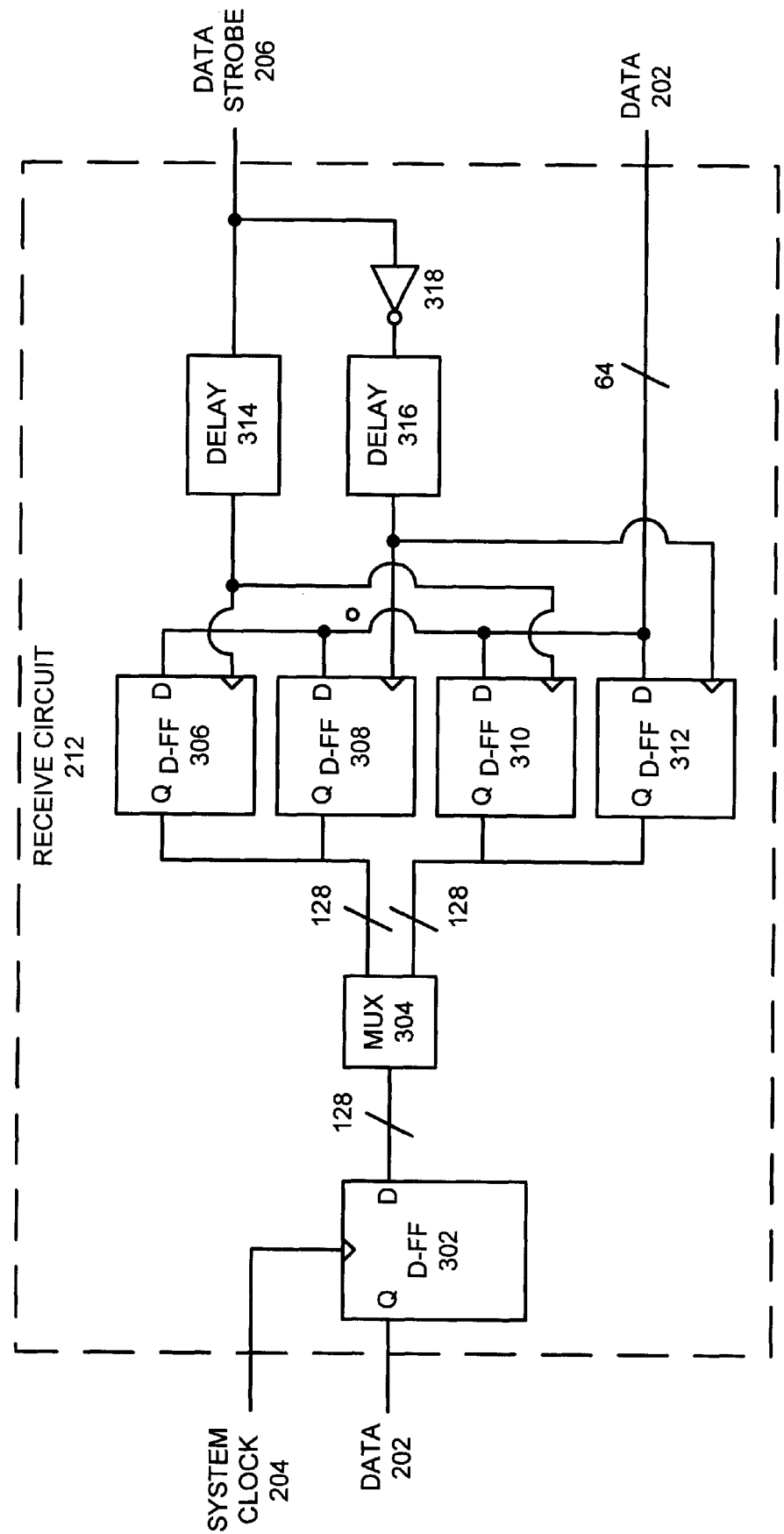
FIG. 3 illustrates a circuit for receiving data from a memory during a read operation in accordance with an embodiment of the present invention.

FIG. 3 illustrates the internal structure of receive circuit 212 in accordance with an embodiment of the present invention. Receive circuit 212 receives data signal 202 and data strobe signal 206 from input drivers 214 in FIG. 1. Data signal 202, which is 64 bits wide, feeds into four different D-flip-flips (D-FFs) 306, 308, 310 and 312. Data strobe signal 206 feeds into clock inputs of D-FFs 306, 308, 310 and 312, and is used to latch data signal 202 into each of D-FFs 306, 308, 310 and 312. More specifically, data strobe signal 206 passes through delay circuit 314 into clock inputs of D-FFs 306 and 310. Data strobe signal 206 also passes through inverter 318 and delay circuit 316 into clock inputs of D-FFs 308 and 312. Hence, D-FFs 306 and 310 are clocked on the rising edge of data strobe signal 206, while D-FFs 308 and 312 are clocked on the falling edge of data strobe signal 206. Note that delay circuits 314 and 316 can be programmed to precisely synchronize data strobe signal 206 with data signal 202.

The outputs of D-FFs 306, 308, 310 and 312 pass through MUX 304 into 128-bit wide D-FF 302. MUX 304 is a two-to-one multiplexer that selects between either D-FFs 306 and 308, or D-FFs 310 and 312. The select line for MUX 304 (not shown) is generated by state machine 210. MUX 304 allows receive circuit 212 to ping-pong between receiving data in D-FFs 306 and 308, and receiving data in D-FFs 310 and 312.

D-FF 302 is 128-bits wide and is clocked by system clock 204. Once data signal 202 is clocked into D-FF 302, data signal 202 is in the clock domain of system clock 204.

In another embodiment of the present invention, memory 104 includes a plurality of different memory modules, and the system maintains a different set of delay values for each memory module. This allows the system to control skew at the memory module level, which can be quite useful because skew can vary between different memory modules.

Delay Circuit

Figure 4:
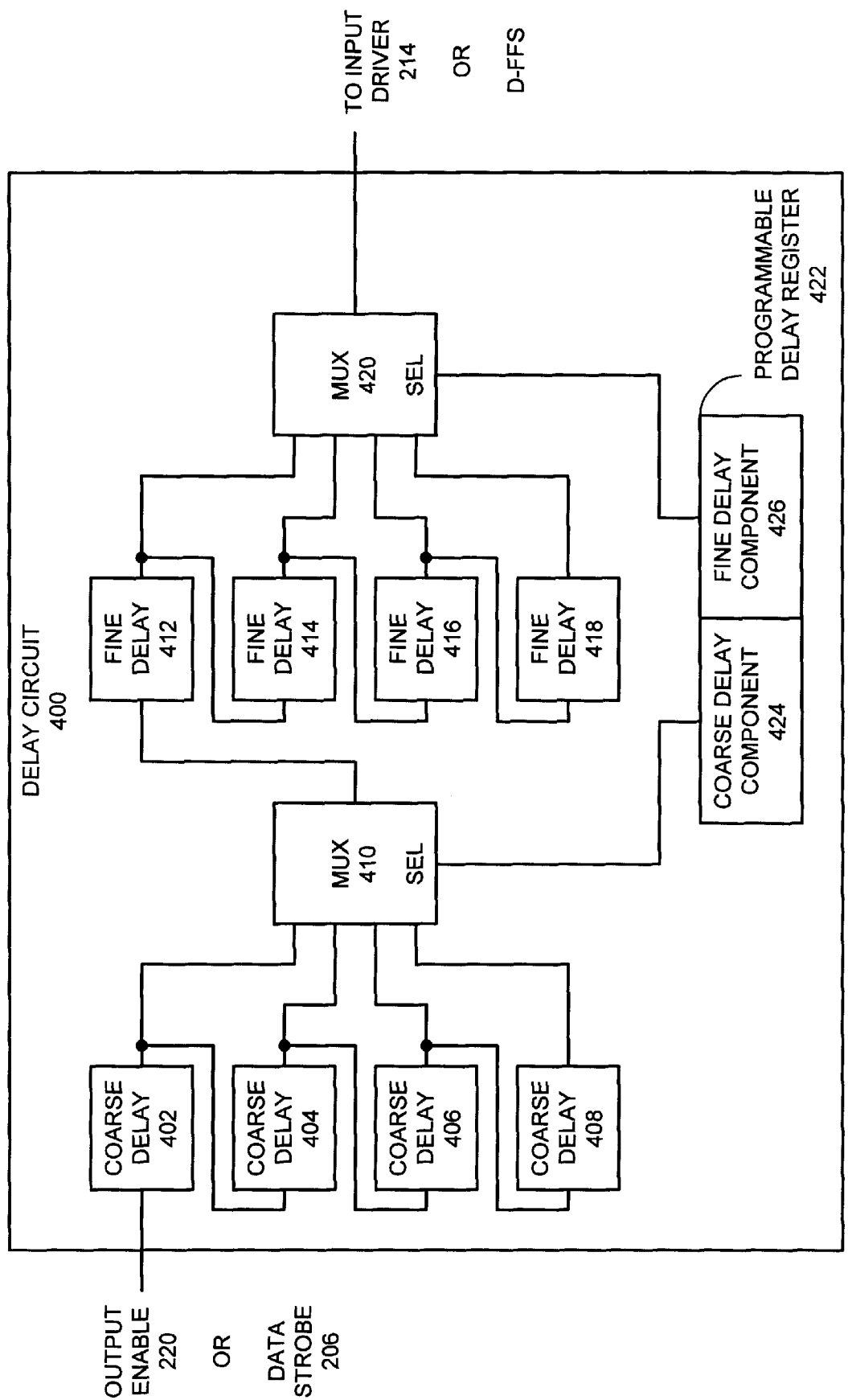
FIG. 4 illustrates a programmable delay circuit in accordance with an embodiment of the present invention.

FIG. 4 illustrates programmable delay circuit 400 in accordance with an embodiment of the present invention. Programmable delay circuit 400 represents the internal structure of delay circuit 218 from FIG. 2, or delay circuits 314 and 316 from FIG. 3. In one application, programmable delay circuit 400 receives an enable signal 220 and produces a delayed output that feeds into an enable input of input drivers 214 to enable driving of input drivers 214. In another application, programmable delay circuit 400 receives data strobe signal 206 and produces a delayed output that feeds into a clock input of a D-flip-flop in order to latch a data signal into the D-flip-flop.

The input into programmable delay circuit 400 passes through a chain of coarse delay elements 402, 404, 406 and 408. The outputs of coarse delay. elements 402, 404, 406 and 408 feed into MUX 410. MUX 410 selects between the outputs of coarse delay elements 402, 404, 406 and 408 to generate an output that feeds into a chain of fine delay elements 412, 414, 416 and 418. The outputs of fine delay elements 412, 414, 416 and 418 feed into MUX 420. MUX 420 selects between the outputs of fine delay elements 412, 414, 416 and 418 to generate an output for delay circuit 400.

Programmable delay register 422 controls MUX 410 and MUX 420. More specifically, coarse delay component 424 of programmable delay register 422 controls MUX 410, while fine delay component 426 controls MUX 420. Thus, delay circuit 400 has a coarse adjustment through MUX 410 and a fine adjustment through MUX 420. Note that programmable delay register 422 is memory mapped so that it can be loaded by a processor.

In another embodiment of the present invention, delay circuit 400 includes only a single MUX 410 and only supports only a single coarse delay adjustment. In this embodiment, the output of MUX 410 becomes the output of delay circuit 400.

Synchronizing Signals During a Read Operation

Figure 5:
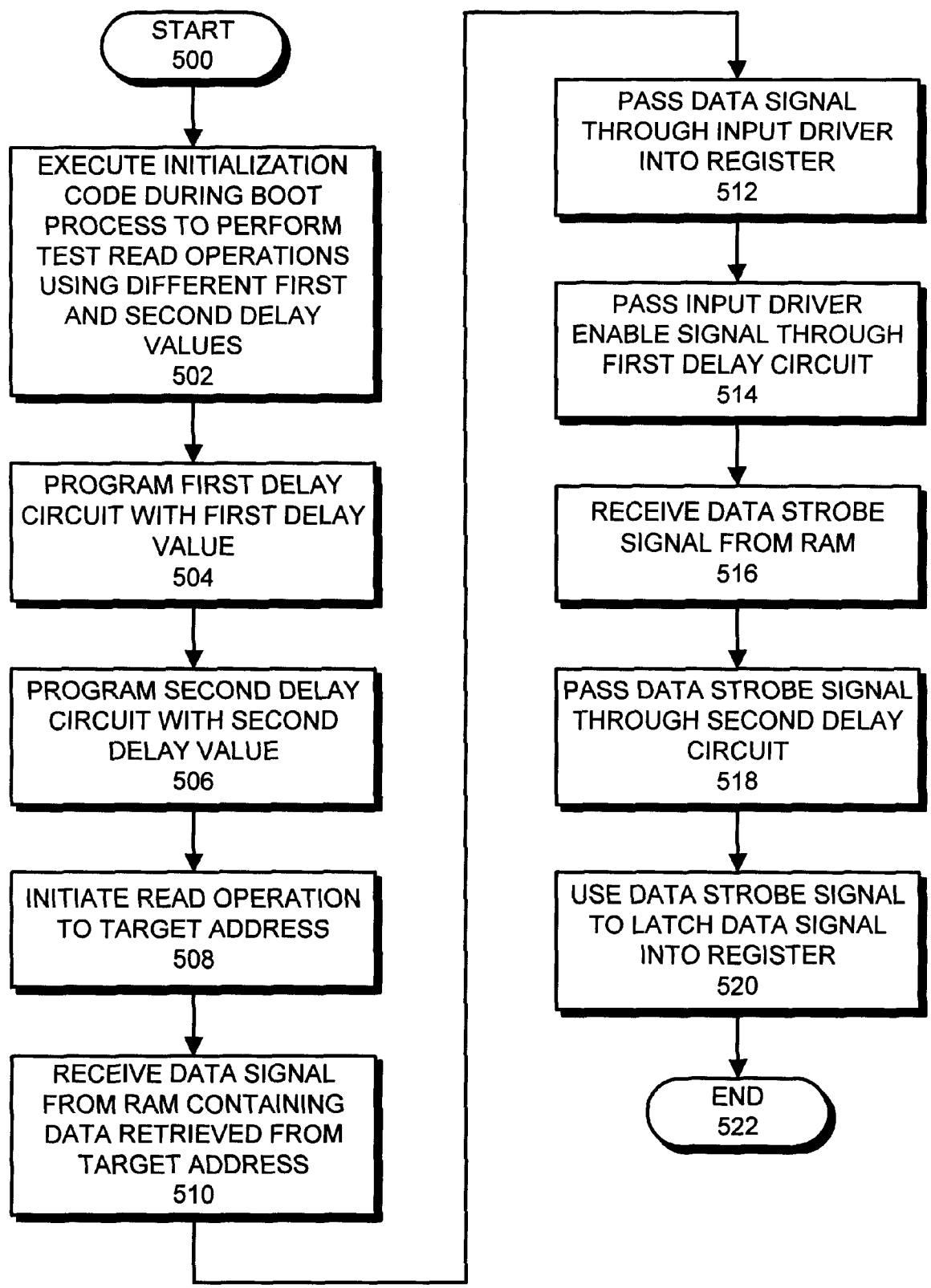
FIG. 5 is a flow chart illustrating the process of using delay circuitry to synchronize various signals during a read operation in accordance with an embodiment of the present invention.

FIG. 5 is a flow chart illustrating the process of using delay circuitry to synchronize various signals during a read operation in accordance with an embodiment of the present invention. The system first determines delay values to be loaded into delay circuits 218, 314 and 316 (step 502). This can be accomplished during a system boot process by executing BIOS code 142 that performs test read operations using different delay values as is discussed below with reference to FIG. 6. Once the optimal delay values are determined, the delay values are programmed into first delay circuit 218 (step 504) and a second delay circuit 314 (step 506).

Next, the system initiates a read operation to a target address in memory 104 (step 508). In response to the read operation, memory 104 returns data signal 202 containing a data value retrieved from the target address (step 510). This data signal 202 is passed through input drivers 214 into a register comprised of D-FFs 306, 308, 310 and 312 (step 512). Input drivers 214 are enabled by enable signal 220 that passes from state machine 210, through first delay circuit 218, and into an enable input of input drivers 214 (step 514). Note that state machine 210 de-asserts enable signal 220 a fixed amount of time later, and this de-asserted signal is similarly be delayed by first delay circuit 218.

Alternatively, in another embodiment of the present invention, enable signal 220 is de-asserted by a separate signal from state machine 210 that feeds through a third delay circuit (not shown) before being ANDed with enable signal 220. This allows the system to separately control the delay until de-assertion of enable signal 220.

Note that by controlling the timing of assertion and de-assertion of enable signal 220, the system can control pre-charge time for the register that receives data signal 202.

While data signal 202 is being received from memory 104, data strobe signal 206 is received from memory 104 (step 516). Data strobe signal 206 passes through second delay circuit 314 (step 518), and is then used to latch data signal 202 into D-FFs 306, 308, 310 and 312 (step 520).

In one embodiment of the present invention, the system periodically measuring deviations in propagation delay through the first delay circuit 218 and/or through the second delay circuit 314 relative to system clock 204. If necessary, the first programmable delay circuit 218 and/or the second programmable delay circuit 314 are adjusted to compensate for measured deviations.

Determining Delay Values

Figure 6:
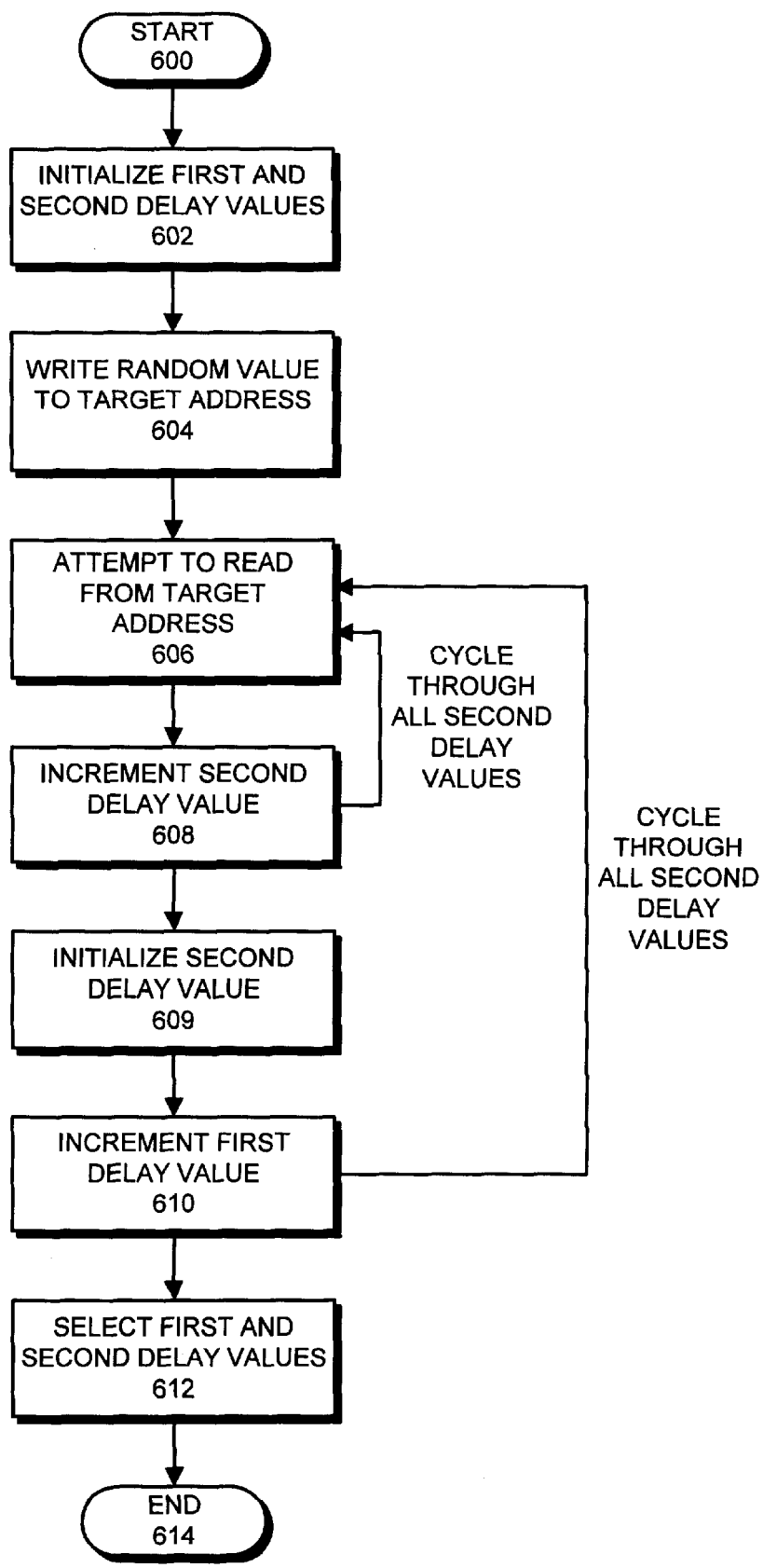
FIG. 6 is a flow chart illustrating the process of running tests to determine delay values in accordance with an embodiment of the present invention.

FIG. 6 is a flow chart illustrating the process of running tests to determine delay values in accordance with an embodiment of the present invention. The system first initializes the first delay value and the second delay value to their lowest possible values (step 602). Next, the system writes a random value to a target address in memory 104 (step 604). The system next attempts to read the random value from the target address (step 606) and keeps a record of whether the read operation was successful. In the inner loop in FIG. 6, the system increments the second delay value (step 608) to cycle through all second delay values. In the outer loop, the system increments the first delay value (step 610) to cycle through all first delay values. After cycling through all inner and outer loops, the system has tested all possible combinations of delay values. Next, the system selects a first delay value in the middle of a valid range of first delay values, and similarly selects a second delay value from the middle of a valid range of second delay values (step 612).

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. An apparatus that synchronizes a data signal and a data strobe signal received from a random access memory, wherein the random access memory is configured to adhere to the double data rate (DDR) memory interface standard, the data strobe signal being sent by the random access memory in order to latch the data signal, wherein the apparatus resides within a processor, the apparatus comprising:

a mechanism that initiates a read operation to the random access memory including sending a target address for the read operation to the random access memory;

an input driver that receives the data signal from the random access memory, the data signal containing data retrieved from the target address;

a register comprised of a first set of flip-flops and a second set of flip-flops coupled to the input driver that stores the data signal, the register including a clock input for latching the data signal into the register, wherein the first set and the second set are used alternately in ping-pong fashion to improve throughput;

an enable input on the input driver for enabling the input driver to drive the data signal into the register;

a first programmable delay circuit coupled to the enable input to delay an enable signal from the system clock feeding into the enable input so as to synchronize the driving of the input driver with the data signal received from the random access memory; and a second programmable delay circuit coupled between the data strobe signal and the clock input of the register, the second programmable delay circuit being configured to delay the data strobe signal from the memory so as to synchronize the data strobe signal with the data signal received from the random access memory.

2. The apparatus of claim 1, further comprising:

a mechanism to program the first programmable delay circuit with a first delay value; and a mechanism to program the second programmable delay circuit with a second delay value.

3. The apparatus of claim 2, further comprising an initialization mechanism that determines the first delay value and the second delay value by performing test read operations using a plurality of different combinations of different first delay values and different second delay values.

4. The apparatus of claim 3, wherein the initialization mechanism includes code executed during a system boot process that determines the first delay value and the second delay value.

5. The apparatus of claim 1, wherein the first programmable delay circuit includes a coarse delay adjustment mechanism and a fine delay adjustment mechanism.

6. The apparatus of claim 1, wherein the second programmable delay circuit includes a coarse delay adjustment mechanism and a fine delay adjustment mechanism.

7. The apparatus of claim 1, further comprising a circuit that de-asserts the enable signal a fixed amount of time after the enable signal is asserted.

8. The apparatus of claim 1, further comprising a circuit that de-asserts the enable signal a programmable amount of time after the enable signal is asserted.

9. The apparatus of claim 1, wherein the random access memory is comprised of a plurality of memory modules, and wherein a different first delay value and a different second delay value are associated with each memory module, and further comprising a mechanism that examines the target address to determine which memory module the target address is directed to in order to determine an associated first delay value and an associated second delay value.

10. The apparatus of claim 1, further comprising a re-calibration mechanism that:

periodically measures deviations in propagation delay through the first programmable delay circuit relative to a system clock, the deviations being caused by variations in operating parameters including voltage and temperature, and adjusts the first programmable delay circuit, if necessary, to compensate for measured deviations.

11. An apparatus that synchronizes a data signal and a data strobe signal received from a random access memory, wherein the random access memory is configured to adhere to the double data rate (DDR) memory interface standard, the data strobe signal being sent by the random access memory in order to latch the data signal, wherein the apparatus resides within a processor, the apparatus comprising:

a mechanism that initiates a read operation to the random access memory including sending a target address for the read operation to the random access memory;

an input driver that receives the data signal from the random access memory, the data signal containing data retrieved from the target address;

a register comprised of a first set of flip-flops and a second set of flip-flops coupled to the input driver that stores the data signal, the register including a clock input for latching the data signal into the register, wherein the first set and the second set are used alternately in ping-pong fashion to improve throughput;

an enable input on the input driver for enabling the input driver to drive the data signal into the register;

a first programmable delay circuit coupled to the enable input to delay an enable signal from the system clock feeding into the enable input so as to synchronize the driving of the input driver with the data signal received from the random access memory;

a second programmable delay circuit coupled between the data strobe signal and the clock input of the register, the second programmable delay circuit being configured to delay the data strobe signal from the memory so as to synchronize the data strobe signal with the data signal received from the random access memory;

a mechanism to program the first programmable delay circuit with a first delay value;

a mechanism to program the second programmable delay circuit with a second delay value; and an initialization mechanism that determines the first delay value and the second delay value by executing code during a system boot process to perform test read operations using a plurality of different combinations of different first delay values and different second delay values.

12. The apparatus of claim 11, wherein the first programmable delay circuit includes a coarse delay adjustment mechanism and a fine delay adjustment mechanism.

13. The apparatus of claim 11, further comprising a circuit that de-asserts the enable signal a fixed amount of time after the enable signal is asserted.

14. The apparatus of claim 11, further comprising a circuit that de-asserts the enable signal a programmable amount of time after the enable signal is asserted.

15. The apparatus of claim 11, wherein the random access memory is comprised of a plurality of memory modules, and wherein a different first delay value and a different second delay value are associated with each memory module, and further comprising a mechanism that examines the target address to determine which memory module the target address is directed to in order to determine an associated first delay value and an associated second delay value.

16. The apparatus of claim 11, further comprising a re-calibration mechanism that:

periodically measures deviations in propagation delay through the first programmable delay circuit relative to a system clock, the deviations being caused by variations in operating parameters including voltage and temperature, and adjusts the first programmable delay circuit, if necessary, to compensate for measured deviations.

17. An computer system that synchronizes a data signal and a data strobe signal, the data strobe signal being sent in order to latch the data signal, comprising:

a processor;

a secondary storage device; and a random access memory, wherein the random access memory is configured to adhere to the double data rate (DDR) memory interface standard;

wherein the processor includes:

a mechanism that initiates a read operation from the processor to the random access memory including sending a target address for the read operation to the random access memory;

an input driver that receives the data signal from the random access memory, the data signal containing data retrieved from the target address, a register comprised of a first set of flip-flops and a second set of flip-flops coupled to the input driver that stores the data signal, the register including a clock input for latching the data signal into the register, wherein the first set and the second set are used alternately in ping-pong fashion to improve throughput, an enable input on the input driver for enabling the input driver to drive the data signal into the register, a first programmable delay circuit coupled to the enable input to delay an enable signal from the system clock feeding into the enable input so as to synchronize the driving of the input driver with the data signal received from the random access memory, and a second programmable delay circuit coupled between the data strobe signal and the clock input of the register, the second programmable delay circuit being configured to delay the data strobe signal from the memory so as to synchronize the data strobe signal with the data signal received from the random access memory.

18. A computer readable storage medium storing instructions that when executed by a computer cause the computer to perform a method for adjusting a data signal and a data strobe signal received from a random access memory, wherein the random access memory is configured to adhere to the double data rate (DDR) memory interface standard, comprising:

writing a value to a target address in the random access memory;

initiating a read operation to the random access memory including sending the target address to the random access memory;

receiving the data signal from the random access memory at a processor, the data signal containing data retrieved from the target address, wherein receiving the data signal involves alternately receiving the data signal in a first set of flip-flops of a data register within the processor and a second set of flip-flops of the data register within the processor to improve throughput;

passing the data signal through an input driver into a register within the processor by asserting an enable signal to enable the input driver;

wherein asserting the enable signal includes passing the enable signal from the system clock through a first programmable delay circuit within the processor that has been programmed with a first delay value;

receiving a data strobe signal from the random access memory, the data strobe signal being sent by the random access memory to latch the data signal into the register;

delaying the data strobe signal by passing the data strobe signal from the memory through a second programmable delay circuit within the processor that has been programmed with a second delay value;

using the data strobe signal to latch the data signal into the register;

comparing a contents of the register with the value written to the target address; and repeating the acts of writing the value, receiving the data signal, latching the data signal and comparing the data signal for a range of different first delay values and different second delay values in order to determine a best first delay value and a best second delay value.

* * * * *